United States Patent
Garza et al.

(10) Patent No.: US 6,269,472 B1
(45) Date of Patent: *Jul. 31, 2001

(54) OPTICAL PROXIMITY CORRECTION METHOD AND APPARATUS

(75) Inventors: Mario Garza, Sunnyvale; John V. Jensen, Fremont; Nicholas K. Eib; Keith K. Chao, both of San Jose, all of CA (US)

(73) Assignee: LSI Logic Corporation, Milpitas, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/991,785

(22) Filed: Dec. 12, 1997

Related U.S. Application Data

(63) Continuation-in-part of application No. 08/607,365, filed on Feb. 27, 1996, now Pat. No. 5,723,233.

(51) Int. Cl.$^7$ .................................................. G03F 9/00
(52) U.S. Cl. .................................................. 716/21
(58) Field of Search ........................ 395/500.02; 716/21

(56) References Cited

U.S. PATENT DOCUMENTS

| | | | |
|---|---|---|---|
| 4,812,962 | 3/1989 | Witt | 716/21 |
| 5,475,766 | 12/1995 | Tsuchiya et al. | 382/144 |
| 5,553,273 | 9/1996 | Liebmann | 716/21 |
| 5,553,274 | 9/1996 | Liebmann | 716/21 |
| 5,663,893 | * 9/1997 | Wampler | 716/1 |
| 5,681,674 | 10/1997 | Fujimoto | 430/5 |
| 5,682,323 | 10/1997 | Pasch et al. | |
| 5,705,301 | 1/1998 | Garza et al. | 430/5 |
| 5,723,233 | 3/1998 | Garza et al. | 430/5 |
| 5,795,682 | 8/1998 | Garza | |
| 5,877,045 | 3/1999 | Kapoor | 438/151 |
| 5,900,338 | 5/1999 | Garza et al. | 430/5 |
| 6,078,738 | 6/2000 | Garza | |

FOREIGN PATENT DOCUMENTS

| | | |
|---|---|---|
| 2291219 | 1/1996 | (EP) . |
| 0698916A2 | 2/1996 | (EP) . |
| 0822452A2 | 2/1998 | (EP) . |
| 2291 219 | 1/1996 | (GB) .................... G03F/1/00 |
| 02139426 | 2/1992 | (JP) . |
| 02178008 | 2/1992 | (JP) . |
| 04232103 | 3/1994 | (JP) . |
| 04273199 | 5/1994 | (JP) . |
| 05150734 | 1/1995 | (JP) . |
| 07198770 | 2/1997 | (JP) . |
| 07301155 | 6/1997 | (JP) . |
| 08100471 | 11/1997 | (JP) . |

OTHER PUBLICATIONS

Henderson et al., "CD Data Requirements for Proximity Effect Corrections", 1994, Photomask Technology and Management, SPIE, vol. 2322, pp. 218–228.

(List continued on next page.)

*Primary Examiner*—Paul R. Lintz
*Assistant Examiner*—Thuan Do

(57) ABSTRACT

Disclosed is a method for correcting a layout design using a design rule checker. The method includes providing a layout design file having the layout design that is to be corrected for optical proximity by the design rule checker. Providing a run set to the design rule checker. The run set includes a plurality of correction values that are used to correct a plurality of features of the layout design that have a selected space dimension. Identifying each of the plurality of features that have the selected space dimension. The method further includes correcting each of the plurality of features that have the selected space dimension with one correction value of the plurality of correction values of the run set. Preferably, the run set is generated from a correction table that has the plurality of correction values.

22 Claims, 14 Drawing Sheets

OTHER PUBLICATIONS

Stirniman et al., "Optimizing Proximity Correction For Wafer Fabrication Processes", Photomask Technology and Management, SPIE, vol. 2322, pp. 239–246.

Socha et al., "Effects of Wafer Topography on the Formation of Polysilicon Gates", SPIE, vol. 2440, pp. 361–371.

Barouch et al., "OPTIMASK: An OPC Algorithm For Chrome and Phase–Shift Mask Design", SPIE, vol. 2440, pp. 192–206 No Date.

Futatsuya et al., "Practical Method of Evaluating Two Dimensional Resist Features For Lithographic DRC", SPIE, vol. 3051, pp. 499–508 No Date.

J. Stirniman, M. Rieger "Optimizing proximity correction for wafer fabrication processes", XP 000607940, pp. 239–246, Precim Company, Portland, OR, SPIE vol. 2322 Photomask Tech. Mgmt. (Mar. 1994).

R.C. Henderson and O.W. Otto, "CD data requirements for proximity effect corrections", XP 000607939, pp. 218–228, Trans Vector Tech., Inc., Camarillo, CA, SPIE vol. 2322, Photomask Tech. Mgmt. (Mar. 1994).

* cited by examiner

| Edge to Edge Space Increments | Correction PER Edeg |
|---|---|
| 0.4 | 0.02 |
| 0.5 | 0.015 |
| 0.6 | 0.010 |
| 0.7 | 0.010 |
| 0.8 | 0.005 |
| 0.9 | 0.005 |
| 1.0 | 0.00 |

OPTICAL PROXIMITY CORRECTION METHOD AND APPARATUS

CROSS REFERENCE TO RELATED APPLICATIONS

This application is a continuation-in-part of pending U.S. patent application Ser. No. 08/607,365, filed Feb. 27, 1996 now U.S. Pat. No. 5,723,233, entitled "Optical Proximity Correction Method and Apparatus," and naming Mario Garza, Nicholas K. Eib, and Keith K. Chao as inventors. The contents of this pending application are incorporated herein by reference for all purposes.

BACKGROUND OF THE INVENTION

1. Field of the Invention

The present invention relates to photolithography techniques. More particularly, the invention relates to improved methods and apparatuses for performing optical proximity correction.

2. Description of the Related Art

The minimum feature sizes of integrated circuits (ICs) have been shrinking for years. Commensurate with this size reduction, various process limitations have made IC fabrication more difficult. One area of fabrication technology in which such limitations have appeared is photolithography.

Photolithography involves selectively exposing regions of a resist coated silicon wafer to a radiation pattern, and then developing the exposed resist in order to selectively protect regions of wafer layers (e.g., regions of substrate, polysilicon, or dielectric).

An integral component of photolithographic apparatus is a "reticle" which includes a pattern corresponding to features at one layer in an IC design. Such reticle typically includes a transparent glass plate covered with a patterned light blocking material such as chromium. The reticle is placed between a radiation source producing radiation of a pre-selected wavelength and a focusing lens which may form part of a "stepper" apparatus. Placed beneath the stepper is a resist covered silicon wafer. When the radiation from the radiation source is directed onto the reticle, light passes through the glass (regions not having chromium patterns) and projects onto the resist covered silicon wafer. In this manner, an image of the reticle is transferred to the resist.

The resist (sometimes referred to as a "photoresist") is provided as a thin layer of radiation-sensitive material that is spin-coated over the entire silicon wafer surface. The resist material is classified as either positive or negative depending on how it responds to light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor. For further information on IC fabrication and resist development methods, reference may be made to a book entitled *Integrated Circuit Fabrication Technology* by David J. Elliott, McGraw Hill, 1989.

FIG. 1A shows a hypothetical reticle 100 corresponding to an IC layout pattern. For simplicity, the IC pattern consists of three rectangular design features. A clear reticle glass 110 allows radiation to project onto a resist covered silicon wafer. Three rectangular chromium regions 102, 104 and 106 on reticle glass 110 block radiation to generate an image corresponding to intended IC design features.

As light passes through the reticle, it is refracted and scattered by the chromium edges. This causes the projected image to exhibit some rounding and other optical distortion. While such effects pose relatively little difficulty in layouts with large feature sizes (e.g., layouts with critical dimensions above about 1 micron), they can not be ignored in layouts having features smaller than about 1 micron. The problems become especially pronounced in IC designs having feature sizes near the wavelength of light used in the photolithographic process.

FIG. 1B illustrates how diffraction and scattering affect an illumination pattern produced by radiation passing through reticle 100 and onto a section of silicon substrate 120. As shown, the illumination pattern contains an illuminated region 128 and three dark regions 122, 124, and 126 corresponding to chromium regions 102, 104, and 106 on reticle 100. The illuminated pattern exhibits considerable distortion, with dark regions 122, 124, and 126 having their corners rounded and their feature widths reduced. Other distortions commonly encountered in photolithography (and not illustrated here) include fusion of dense features and shifting of line segment positions. Unfortunately, any distorted illumination pattern propagates to a developed resist pattern and ultimately to IC features such as polysilicon gate regions, vias in dielectrics, etc. As a result, the IC performance is degraded or the IC becomes unusable.

To remedy this problem, a reticle correction technique known as optical proximity correction ("OPC") has been developed. Optical proximity correction involves adding dark regions to and/or subtracting dark regions from a reticle design at locations chosen to overcome the distorting effects of diffraction and scattering. Typically, OPC is performed on a digital representation of a desired IC pattern. First, the digital pattern is evaluated with software to identify regions where optical distortion will result. Then the optical proximity correction is applied to compensate for the distortion. The resulting pattern is ultimately transferred to the reticle glass.

FIG. 1C illustrates how optical proximity correction may be employed to modify the reticle design shown in FIG. 1A and thereby better provide the desired illumination pattern. As shown, a corrected reticle 140 includes three base rectangular features 142, 144, and 146 outlined in chromium on a glass plate 150. Various "corrections" have been added to these base features. Some correction takes the form of "serifs" 148a–148f and 149a–149f. Serifs are small appendage-type addition or subtraction regions typically made at corner regions on reticle designs. In the example shown in FIG. 1C, the serifs are square chromium extensions protruding beyond the corners of base rectangles 142, 144, and 146. These features have the intended effect of "sharpening" the corners of the illumination pattern on the wafer surface. In addition to serifs, the reticle 140 includes segments 151a–151d to compensate for feature thinning known to result from optical distortion.

FIG. 1D shows an illumination pattern 160 produced on a wafer surface 160 by radiation passing through the reticle 140. As shown, the illuminated region includes a light region 168 surrounding a set of dark regions 162, 164 and 166 which rather faithfully represent the intended pattern shown in FIG. 1A. Note that the illumination pattern shown in FIG.

1B of an uncorrected reticle has been greatly improved by use of an optical proximity corrected reticle.

Obviously, the degree of optical proximity correction (i.e., the size and location of correction segments) for any IC feature depends upon the desired IC feature size and the location of such feature with respect to other IC features. For example, the width of any one of segments 151a–151d may have to be increased or decreased if the width of any of the base rectangles 142, 144, and 146 is increased or decreased or if the spacing between any of these base rectangles is increased or decreased.

Today, the degree of correction necessary for a given feature is determined largely by empirical methods. That is, experiments are conducted with reticles having "test" patterns to determine the illumination pattern produced on a wafer by light shown through the test pattern. The deviation between the actual illumination pattern and the desired feature pattern is used to determine how much optical proximity correction is required for a reticle used to produce the desired feature pattern. For example, the reticle 100 of FIG. 1A may be used as a test reticle. A single experiment would show that the illumination pattern produced by reticle 100 corresponds to that shown in FIG. 1B. The rounding and thinning effects observed would lead an OPC designer to specify that when the pattern of FIG. 1A is desired, the corrections shown in FIG. 1C should be employed. Specifically, the designer would specify the width and location of segments 151a–151d and serifs 148a–148f and 149a–149f.

Of course, these particular corrections apply only to patterns having the exact size and geometry shown in FIG. 1A. If the width of or separation between the base rectangles changes (in a different IC design for example), the widths and locations of segments 151a–151d would also have to change. Thus, additional experiments with test reticles having patterns of differing feature widths and separations would be necessary to accurately determine the degree of optical proximity correction required for a changed pattern. Given the huge range of IC feature variations on even a single chip, a potentially infinite number of test reticles would have to be produced to account for every pattern that might be encountered. Luckily, for most patterns, it has been found that the degree of optical proximity correction can be estimated with good accuracy by interpolating linearly between the actual amount of correction found to be necessary for two test patterns "straddling" (in terms of sizing and/or spacing) a real feature on an IC design. Further, the degree of correction for very small patterns lying beyond a range of experimental patterns may often be predicted with good accuracy by linear extrapolation. Because these techniques require that only a relatively few test reticles be generated, many OPC systems in use today employ such linear interpolation and extrapolation techniques.

Unfortunately, it has been found that as feature sizes decrease beyond a certain critical dimension (in some cases about 0.5 microns or greater for ultra-violet radiation), the above-described linear interpolation/extrapolation techniques no longer work well. This is because the amount of correction required for a given pattern no longer varies in a linear fashion.

The non-linear effect is depicted in FIGS. 2A and 2B. FIG. 2A shows a reticle 200 having critical dimensions below a linear threshold (e.g., below about 0.5 microns or greater). When a linear optical proximity correction is performed to correct for optical distortions expected in the linear regime, the resulting illumination pattern is unacceptably distorted. Specifically, it has been observed that although serifs 228a–228f and 229a–229f and segments 251a–251d can be added to the reticle design in a manner predicted by conventional linear interpolation/extrapolation, inappropriate fusing and thinning of bars 262, 264, and 266 appear in the illumination pattern on a substrate 260 as shown in FIG. 2B.

To remedy this problem, one might suggest performing more tests in the non-linear regime and using the test results to develop a more detailed OPC protocol. However, the number of experiments required would consume too many resources to be cost effective. Thus, what is needed is an improved method and apparatus for correcting photolithography reticle design patterns having critical dimensions in the non-linear regime without requiring a great many additional experiments.

SUMMARY OF THE INVENTION

The present invention fills this need by providing an optical proximity correction method that employs a non-linear mathematical function for determining the amount of correction required for an arbitrary IC pattern having dimensions in the non-linear correction regime. The non-linear function should be developed to accurately depict the variation in required optical proximity correction with decreasing critical dimension in the non-linear regime described above.

In one embodiment, a method for correcting a layout design using a design rule checker is disclosed. The method includes providing a layout design file having the layout design that is to be corrected for optical proximity by the design rule checker. Providing a run set to the design rule checker. The run set includes a plurality of correction values that are used to correct a plurality of features of the layout design that have a selected space dimension. Identifying each of the plurality of features that have the selected space dimension. The method further includes correcting each of the plurality of features that have the selected space dimension with one correction value of the plurality of correction values of the run set. Preferably, the run set is generated from a correction table that has the plurality of correction values.

In another embodiment, an apparatus for correcting a layout design for optical proximity correction errors is disclosed. The apparatus includes a design layout file containing the layout design. A design rule checker that is configured to iteratively correct the layout design, such that a set of features having a selected inter-feature spacing are corrected before a next set of features having another selected inter-feature spacing. Wherein the design rule checker continues to iteratively correct the layout design until a predetermined number of sets of features are corrected.

In yet another embodiment, a system includes a process for performing optical proximity correction on a layout design file is disclosed. The process is configured to perform the operations of identifying features having a particular width from the layout design file. Selecting a set of features from the identified features that have a predetermined inter-feature spacing. The inter-feature spacing is defined by edges of the selected set of features. The process is further configured to perform the operation of correcting the selected set of features based on a correction value that is derived from a non-linear correction curve, and the correcting is performed on the edges of the selected set of features. Preferably, the selecting and correcting operations are repeated for one or more selected sets of features having different inter-feature spacings.

A particular advantage of the present invention is that an entire layout design may be rapidly corrected with the aid of a DRC checker that is programmed to correct selected features having identified inter-feature spacings. Preferably, the correction implemented by the DRC checker is derived from a non-linear curve that is used to produce a table of correction values. As a further advantage, this optical proximity correction technique may be practiced quite effectively with any well known DRC checker, which advantageously reduces the cost of programming design checking algorithms from scratch. These and other features and advantages of the present invention will become apparent upon reading the following detailed descriptions and studying the various figures of the drawings.

DETAILED DESCRIPTION OF THE PREFERRED EMBODIMENTS

FIGS. 1A–D and 2A–B, as described above, illustrate that some conventional optical proximity correction methods are unable to correct reticle design patterns having very small critical dimensions (e.g., below about 1.2 microns). The present invention utilizes non-linear mathematical expressions to ascertain the degree of correction required for any such patterns having critical dimensions in such non-linear domain. The necessary non-linear mathematical expressions may be generated by various means. In a preferred embodiment, they are generated by curve fitting data from experiments on incrementally sized reticle designs having critical dimensions in the non-linear region. They may also be generated from computer simulated data of patterns having critical dimensions in the non-linear region.

A. Preparing Expression For Non-Linear Optical Proximity Correction

Figure 3:
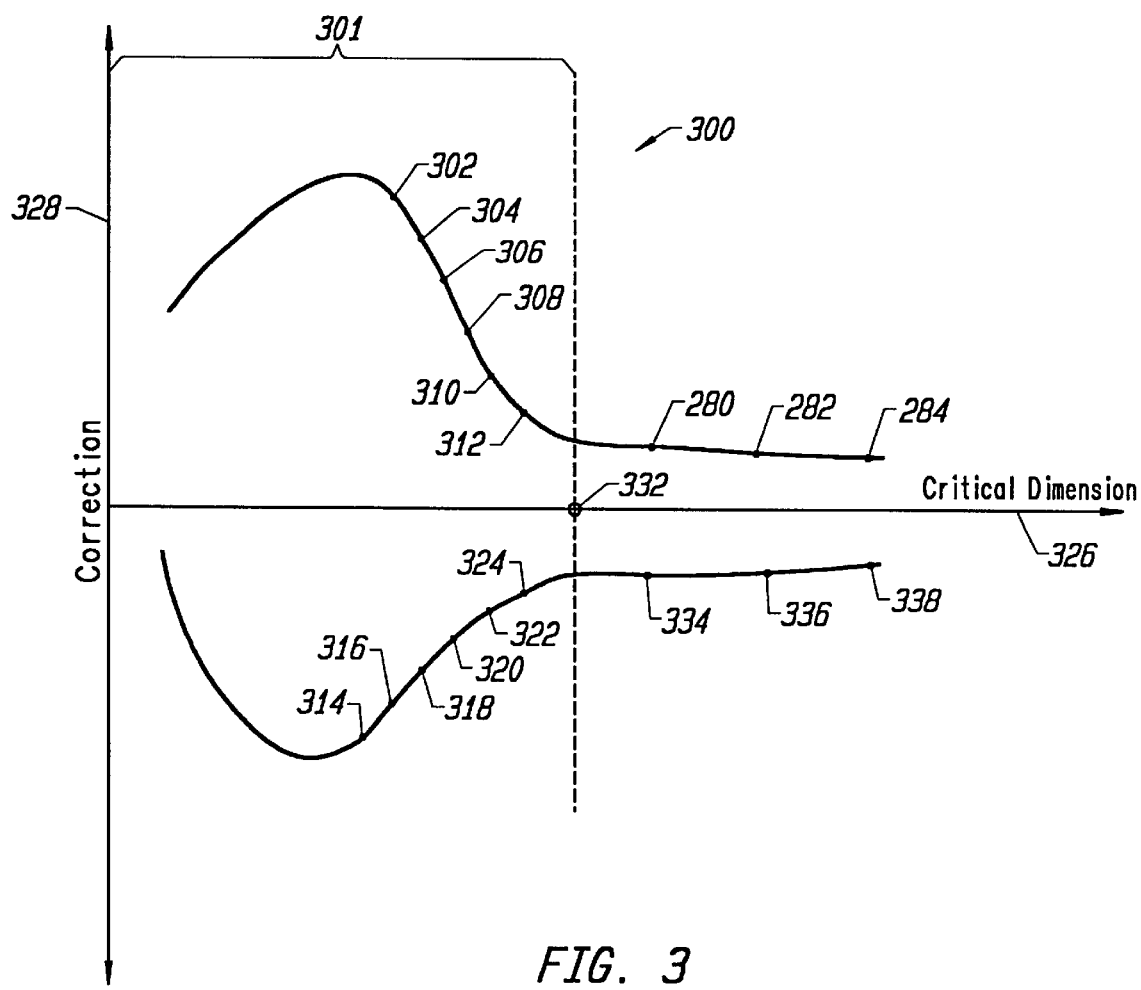
FIG. 3 shows, in accordance with one aspect of the present invention, a plurality of experimentally determined OPC values plotted as functions feature size and spacing size (critical dimensions) for patterns in the linear and non-linear regimes.

The method for preparing non-linear expressions for OPC in accordance with the present invention will now be described with reference to FIGS. 3 through 5. Referring first to FIG. 3, there is shown a graph 300 including mock experimental optical proximity correction values plotted versus (1) a critical dimensions based upon feature size (plotted above the horizontal axis), and (2) critical dimensions based upon spacing between features (plotted below the horizontal axis). By way of example, a critical dimension based upon feature size might be the width of dark region 122 shown in FIG. 1B, while a critical dimension based upon spacing might be the distance between dark regions 122 and 124 in FIG. 1B. In general, the features described herein correspond to IC features such as transistor gate electrodes, metallization conductive lines and the like.

Returning to FIG. 3, representative data points taken from hypothetical test reticles are plotted on a grid having a vertical axis 328 representing optical proximity correction values and a horizontal axis 326 representing the critical dimension (in feature size and spacing between features). As can be seen for values of critical dimension above a point 332, optical proximity correction values vary in a generally linear manner. However, below point 332, the optical proximity correction values vary non-linearly. Specifically, points 302, 304, 306, 308, 310, and 312 specify the degree of correction for feature widths in the non-linear regime, while points 280, 282, and 284 specify the degree of correction for feature widths in the linear regime. Similarly, points 314, 316, 318, 320, 322, and 324 specify the degree of correction required for inter-feature spacing in the non-linear regime, while points 334, 336, and 38 specify the degree of correction required for inter-feature spacing in the linear regime.

For ultra-violet radiation at about 365 nm, the transition between linear and on-linear domains (point 332) sometimes corresponds to a critical dimension of approximately 0.5 microns for both feature width and inter-feature spacing. Of course, the transition between the linear and non-linear regions may occur more gradually than depicted in FIG. 3.

Figure 4:
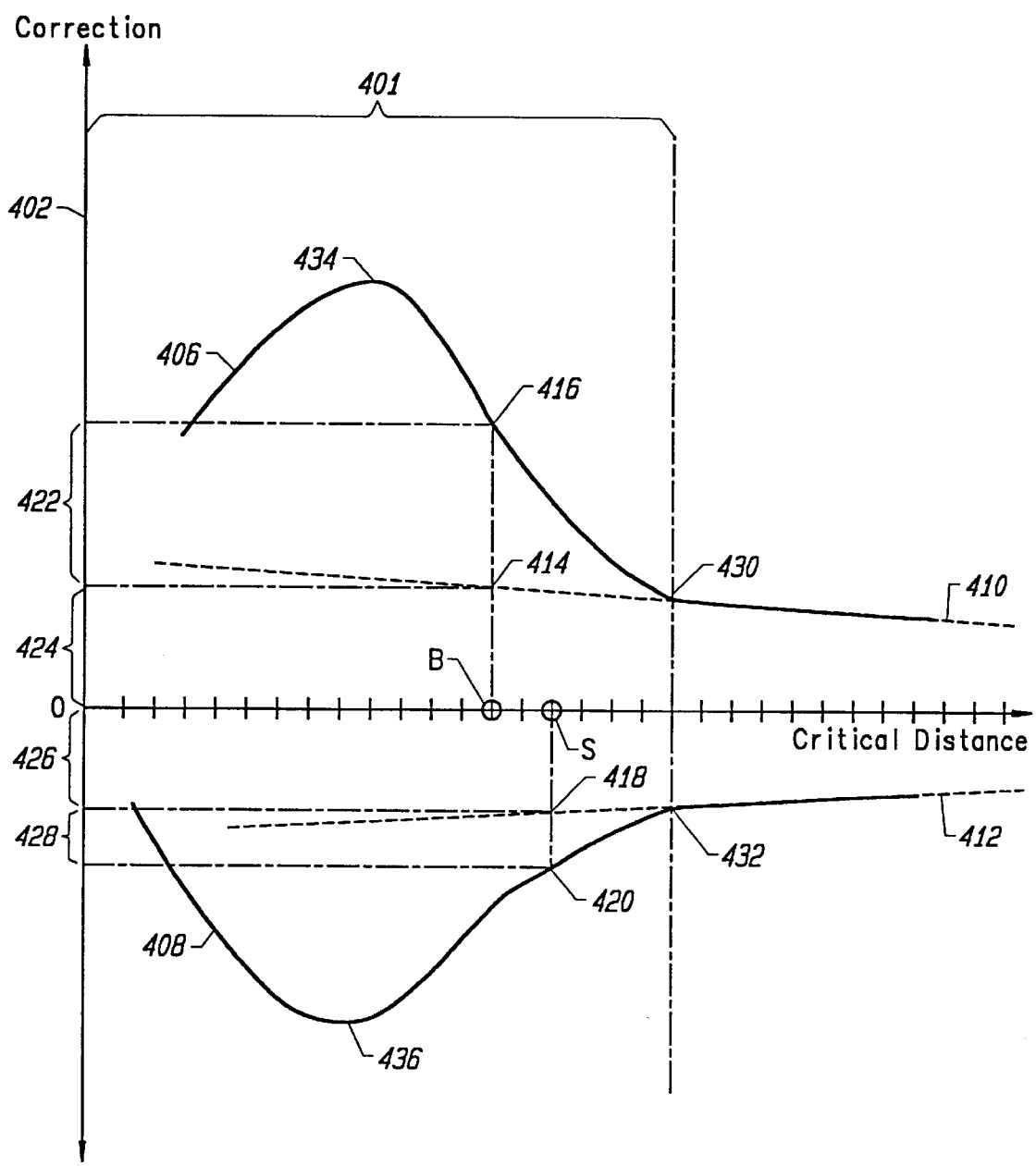
FIG. 4 illustrates, in one embodiment, a mathematical expression designed to express OPC values as functions feature size and spacing size (critical dimensions) for patterns in the linear and non-linear regimes.

FIG. 4 presents a graphical representation 400 of two non-linear mathematical expressions 406 and 408 which provide optical proximity correction values as a continuous function of feature width (in the case of expression 406) and inter-feature spacing (in the case of expression 408). As before, a vertical axis 402 specifies the value of optical proximity correction, while a horizontal axis specifies critical dimension. In a preferred embodiment, expression 406 is generated by curve fitting feature width test data and curve 408 is generated by curve fitting inter-feature spacing test data (such as the data illustrated in FIG. 3). The resulting mathematical expressions have an identifiable non-linear region 401 which extends below point 430 for expression 406, and below point 432 for expression 408. Above points 430 and 432, the expressions 406 and 408 vary in a substantially linear fashion.

Preferably, the non-linear expressions generated in accordance with this invention are devised to apply a relatively wide range expected photolithography conditions. In this manner, a single expression (or group of expressions) can be used in photolithography systems where conditions such as depth of focus vary significantly over the surface of a single wafer. Further, such expression(s) could be used with various photolithography systems which may employ different light intensities for example. To generate in non-linear expressions in accordance with this goal, it may be necessary to conduct multiple experiments with a single reticle under the various conditions described above. Then an appropriate non-linear mathematical expression could be tailored to be accurate over rather wide conditions. In some cases, it may be desirable to include in the expression a term or factor that can be adjusted or calibrated for a variations in a specific condition such as depth of focus.

Returning to FIG. 4, the figure illustrates the difficulty associated with applying a conventional linear interpolation/extrapolation technique to reticle designs for features having critical dimensions in the non-linear domain. For example, if a hypothetical feature edge has an associated width "B," then the correct optical proximity correction value for that feature edge would be identified with a point 416 on non-linear curve 406. Unfortunately if instead of the non-linear correction employed with the present invention, a conventional linear extrapolation technique was employed, a correction value associated with a point 414 would be obtained. As can be seen, point 414 is located on a line 410 extrapolated from known correction values associated with larger critical dimensions in the linear regime, and the linear correction value associated with point 414 is separated from the non-linear correction value associated with point 416 by an increment 422.

Similar results occur for inter-feature spacing corrections based on non-linear curve 408. For example, if a hypothetical spacing having a critical dimension "S" is selected, the degree of optical proximity correction would be associated with a point 420, as shown on curve 408. As above, linear extrapolation techniques would provide an insufficient degree of correction. Specifically, the degree of correction associated with linear extrapolation would be a value at a point 418 on a linear extrapolation line 412. As can be seen, point 418 is associated with the linear correction factor 426 (presented on vertical axis 402), which is short of the actual correction value by an additional non-linear correction factor 428.

Thus, it has been recognized that the amount of optical proximity correction varies non-linearly for critical dimensions below a threshold region (e.g., about 0.5 microns or greater). The present invention builds on this recognition by generating non-linear mathematical expressions which accurately represent optical proximity correction values for reticle designs having feature widths and/or feature spacings in the non-linear regime.

It should be noted that in many instances, it has been observed that curves 406 and 408 change direction at points 434 and 436, respectively. While the present invention can in theory be applied to features having critical dimensions smaller than points 434 and 436, such features are typically too small to be imaged with radiation at conventional wavelengths (e.g., the visible or ultra-violet regions of the electromagnetic spectrum). As a result, shorter wavelength radiation (e.g., X-rays) must be used to image smaller feature patterns.

In general, the non-linear mathematical expressions of this invention may be analytic expressions (e.g., polynomials) or numerical expressions. An analytic expression of this invention may take on a form such as $$V_{OPC} = f(x,y,z),$$

where $V_{OPC}$ is the value of the optical proximity correction and $f(x,y,z)$ is an analytic or numerical expression of the variables x, y, and z. In a some embodiments, only a single variable is used in the expression. That variable might be the value of the feature width or the inter-feature spacing at a location of interest. In some embodiments, two or even three variables may be employed in the same expression. These may be the feature width, the inter-feature spacing, the angle of a feature, or any of a number of other parameters associated with the feature edge of interest.

In one embodiment, the non-linear mathematical expression is stored as a comprehensive lookup table constructed by evaluating the expression at numerous critical dimension values. Using such lookup tables generally simplifies software operations and speeds up computation.

Figure 5:
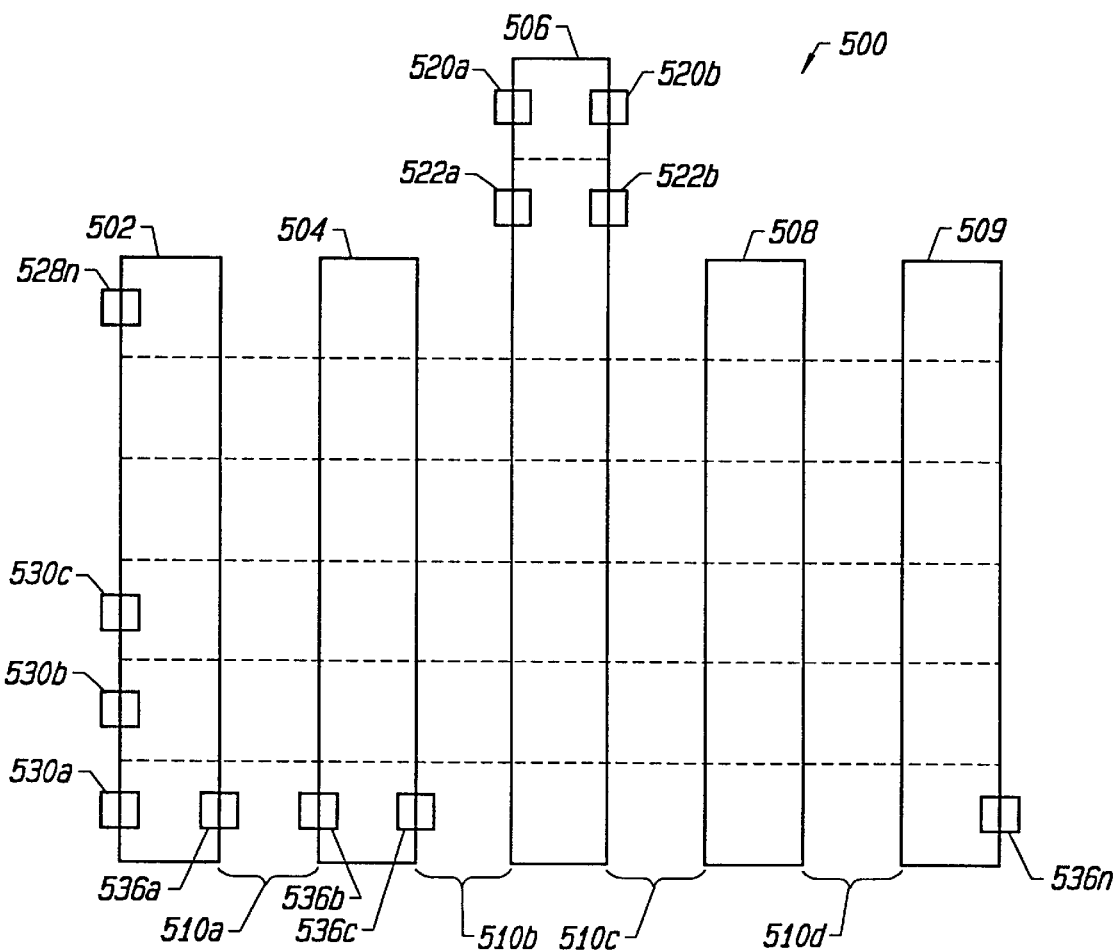
FIG. 5 illustrates, an exemplary reticle test pattern used to generate a empirical OPC corrections necessary to derive the mathematical function presented in FIG. 4.

FIG. 5 shows a simple standardized reticle test pattern 500 known as a "paddle structure" which may be used to generate data for use in preparing a non-linear expression in accordance with this invention. In practice, a resist coated wafer is exposed to light passing through reticle 500. The resist is subsequently developed and the resulting pattern is evaluated with scanning electron microscopy to determine the degree of necessary correction.

The paddle structure has been found to efficiently provide various types of data. Specifically, the structure includes both a dense collection of features in its lower portion (bars 502, 504, 506, 508, and 509) and an isolated feature in its upper portion (bar 506). In general, the amount of correction required is a function of the local feature density, with isolated features requiring a certain amount and type of correction and dense features sometimes requiring a different amount and type of correction. Thus, by performing a single experiment on a reticle with a paddle pattern of a given size and shape, at least two valuable pieces of information can be obtained.

B. Method Of Performing Optical Proximity Correction In The Non-Linear Domain

Figure 6:
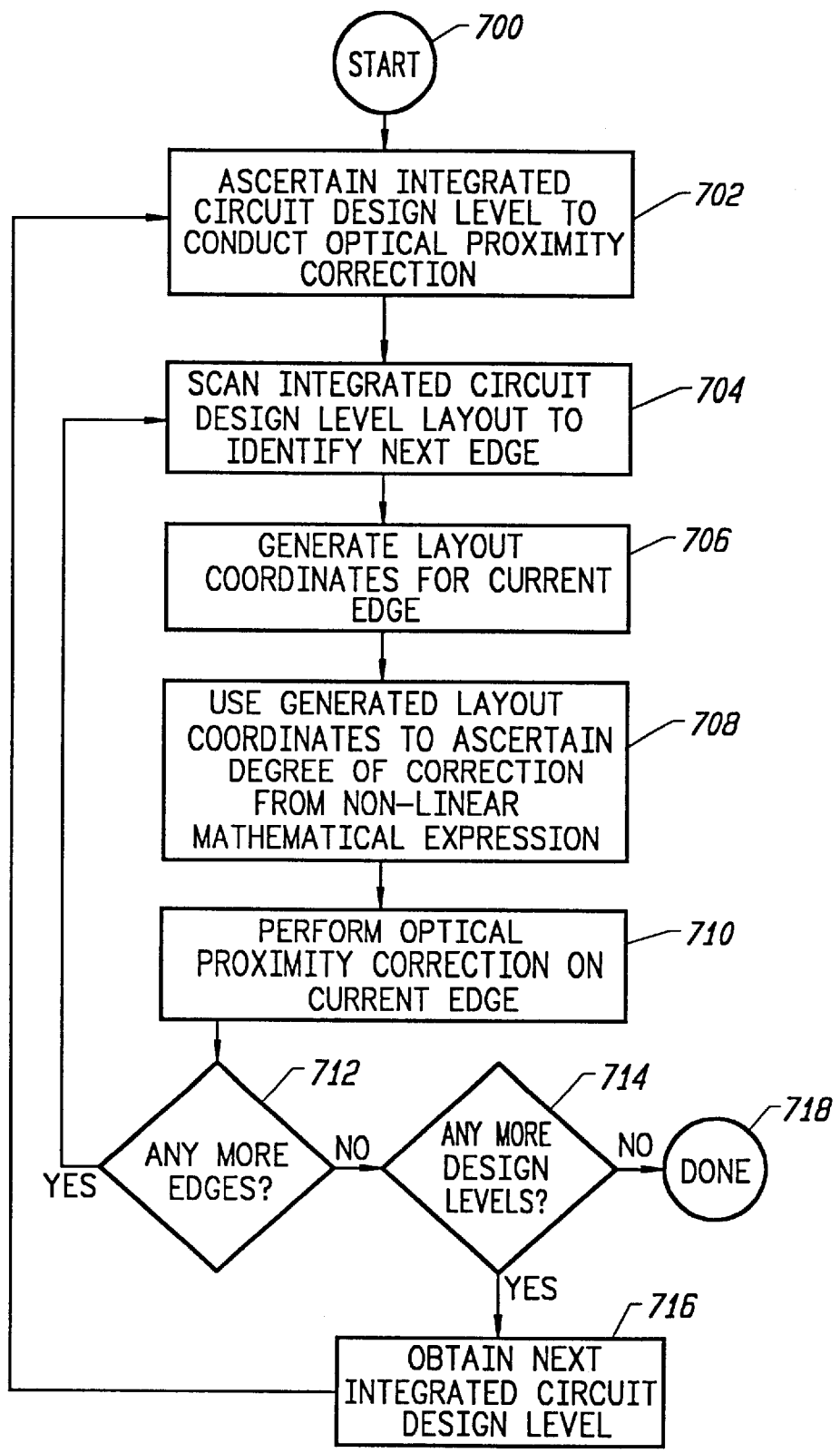
FIG. 6 is a process flow diagram illustrating the steps involved in developing a corrected reticle design in accordance with one embodiment of this invention.

FIG. 6 illustrates a process of the present invention for performing optical proximity correction in the non-linear regime. The process begins at 700 and in a step 702 determines which integrated circuit design level will be subjected to optical proximity correction. It should be understood that integrated circuits are formed with many different mask levels, each of which requires its own reticle. For example, one level may define the pattern for a p-type well implant, another level may define a transistor gate electrode pattern, yet another level may define a first metallization interconnection pattern, etc. For purposes of the process at hand, a design layout for a single level is selected for correction at step 702.

Next, the initial layout design for the selected layout level is obtained and a scan of its features is started at a step 704. The scanning process begins at an arbitrarily selected position of the layout design and proceeds in a defined direction until a feature edge is located. Such edge represents the boundary of a protected and unprotected region on a mask. After the current edge is identified at step 704, the method proceeds to a step 706 where coordinates associated with the current edge are generated. In a preferred embodiment, these coordinates include (1) the width of the feature (e.g., the protected region) at the current edge, and (2) the width of the space (e.g., the unprotected region) between the current edge and the edge of the next adjacent feature. The second coordinate has been referred to above as the "inter-feature spacing." Other possible coordinates associated with the current edge include the edge position of the next successive bar and/or space (beyond the bar and space associated with the current edge itself), the angle of the current edge, etc. In some embodiments, the method includes an additional step of determining whether a feature size exceeds a critical dimension (e.g., one micron). If so, current edge is ignored and the next edge is located. This may substantially improve the computational efficiency of the method by eliminating unnecessary correction calculations.

After the current edge coordinates have been identified in step 706, the method proceeds to a step 708 where the coordinates are evaluated with a non-linear mathematical expression obtained as described above in connection with FIG. 4. As shown in FIG. 4, a particular value of optical proximity correction may be obtained for a feature width or an inter-feature spacing or both. If both the feature width and the inter-feature spacing are used to determine the correction, the non-linear correction expression should be written as a function of at least those two variables. In such cases, the two curves 406 and 408 shown in FIG. 4 would have to be merged in a single function that could be depicted in three-dimensional space.

After the degree of optical proximity correction has been determined for the current edge at step 708, a step 710 performs a correction on the current edge. For example, the feature width may be increased or reduced at that edge, a serif may be added at the edge (see FIG. 1C for example), etc. In addition, correction may also entail shifting entire features in an attempt to prevent features from fusing together. From step 710, the method proceeds to a step 712 where a decision is made as to whether anymore edges are present in the current IC design layout level. If there are more edges, then process control reverts to step 702 where the next edge is identified by scanning in the original direction until the next edge is located. At that point, the new edge becomes the current edge and process steps 706, 708, and 710 are performed at the new current edge. Then, it is determined at step 712 whether any more edges are present.

When all edges in the design layout have been processed and corrected as necessary, (i.e., there are no more edges present in the layout design of the current level), the method proceeds to a step 714 where it is determined whether there are any more design levels. If there are more design levels, the method proceeds to a step 716 where the next design level is obtained. For example, if a layout for a via level has just been completely corrected, step 716 may obtain the design layout for a first metallization layer to be formed immediately on top of the via level. From step 716, the method proceeds to step 702, and from there through steps 704, 706, 708, 710, 712, and if no more edges are present for that level, then the method proceeds to step 714. When all design layout levels to be corrected have been corrected (i.e., decision step 714 is answered in the negative), then the optical proximity correction method is completed at 718.

It should be recognized that the above method is typically implemented as software on a digital computer system. The IC layout designs are provided as digitized patterns defining a desired mask layout on a chip. These digitized patterns are scanned with pattern recognition software which can identify edges and associated feature/spacing sizes. The pattern recognition software may even identify and choose to ignore features that are greater than a predefined size, e.g., one micron. Ultimately, the completely corrected reticle design is formed on an actual reticle such as a glass and chrome reticle.

The non-linear optical proximity correction function may be provided in the form of a programmed equation that can be directly evaluated for each set of coordinates that it receives. More preferably, however, the non-linear function is initially evaluated at numerous dimensions and stored in the form of a look-up table containing a series of discreet points corresponding to correction values for the corresponding feature dimensions. When a new coordinate is provided by the pattern recognition software, the nearest point from the look-up table is identified and used to provide the necessary correction value. Storing the non-linear mathematical function in the form of a look-up table significantly improves computational efficiency.

To further illustrate how the above described method may be implemented, reference is again made to FIG. 5. Specifically, the paddle pattern of FIG. 5 will now be assumed to be an IC design pattern that is to be subjected to non-linear optical proximity correction. As explained above, paddle structure 500 has four identically sized features (bars) 502, 504, 508 and 509 straddling a longer feature 506 having an isolated section at the top of the paddle pattern. In this technique, the optical proximity correction software scans the paddle in a raster-like manner in order to identify all feature edges. During the scanning process, various edges are identified on paddle structure 500.

In one embodiment, the scanning process begins in the lower left corner of the pattern and proceeds horizontally across the pattern. The first feature edge encountered will be 530a. In the context of the FIG. 6 flow diagram, edge 530a becomes the current edge (step 704). Thereafter, appropriate coordinates are obtained, the degree of correction is ascertained, and the correction is made as described with respect to steps 706, 708, and 710. Next, the pattern is horizontally scanned until the next feature edge 536a is identified. This edge is then evaluated per steps 706, 708, and 710. Continuing in this vein, edges 536b, 536c, . . . 536n are encountered, evaluated, and corrected as specified by the non-linear functions described above.

When the end of the right edge of the pattern is encountered, the scanning process increments to a vertically adjacent position and again begins horizontal scanning. For example, the process may next encounter edge 530b. After evaluating and correcting that edge, the next successive edges are located and corrected as described until the right edge of the pattern is again encountered. At that point, the edge 530c is located and corrected. The scanning and correcting process continues in this manner through edge 528n where the pattern changes. At the next vertical increment, only a single feature will be found. Thus, after the top of bars 502, 504, 508, and 509 have been surpassed, the next edge encountered will be 522a. This edge is, of course, corrected as described above. The process thereafter continues through edges 522b, 520a, and 520b.

Often the scanning process will then be repeated in a vertical rasterized manner to pick off and correct horizontally aligned edges. In some IC layout designs, it may also be necessary to conduct raster scans in the diagonal directions at 45_ (or some other angle) with respect to the vertical. The diagonal scans may be employed in designs having lines and other features oriented diagonally with respect to the main grid of the chip.

Each time an edge is encountered, relevant coordinates associated with that edge must be generated (step 706 of FIG. 6). For example, when feature edge 536a is encountered during the scan, the feature width (e.g., the width of bar 502) forms one coordinate, and the inter-feature spacing 510a between bar 502 and next adjacent bar 504 forms a second coordinate. Similar coordinates for edge 536b include the width of bar 504 and the spacing 510a. For edge 536c, the coordinates include the width of bar 504 and spacing 510b. Spacings 510c and 510d would be used in the coordinates of other edges. Edges with no close adjacent features (e.g., edges 520a, 522b, 530a, and 536n) will have a coordinate selected to indicate this condition (e.g. infinity). In a preferred embodiment, any feature separated from an adjacent feature by one micron or more will meet this condition. Certain rules may apply to correcting features with such edges.

For simplicity and efficiency, the scanning process preferably is programmed to ignore critical dimensions greater than about one micron. This is done to increase correction speed for critical dimensions in the non-linear regime. As mentioned above, slight distortions impact sub-micron IC features more severely than IC features having critical dimensions larger than about one micron. In addition, the greater the number of corrections performed, the greater the number of possible errors produced. For example, "slivers" may be inadvertently introduced in an attempt to correct a particular feature geometry. Silvers are common in optical proximity correction, and they many consist of small serifs or segments that are intended to append to an IC feature, but are inadvertently left floating (i.e., unattached to a feature). Thus, limiting optical proximity correction to sub-micron features increases efficiency and avoids introducing additional opportunities for errors.

It should be noted that in addition to the basic calculation of optical proximity correction required for each feature edge, the method of the present invention may employ various design rules to supplement the correction values. Some of these rules may negate a correction provided by the non-linear expressions of this invention. Other rules may modify the correction value without negating the correction. Such rules are typically applied when a given feature and its local environment meet certain criteria. Such rules may, for example, specify a minimum inter-feature spacing for a particular design family. More specifically, such minimum inter-feature may be selected to be between about 0.2 and 0.5 microns (which might be varied within this range by 0.01 microns).

Figure 1A:
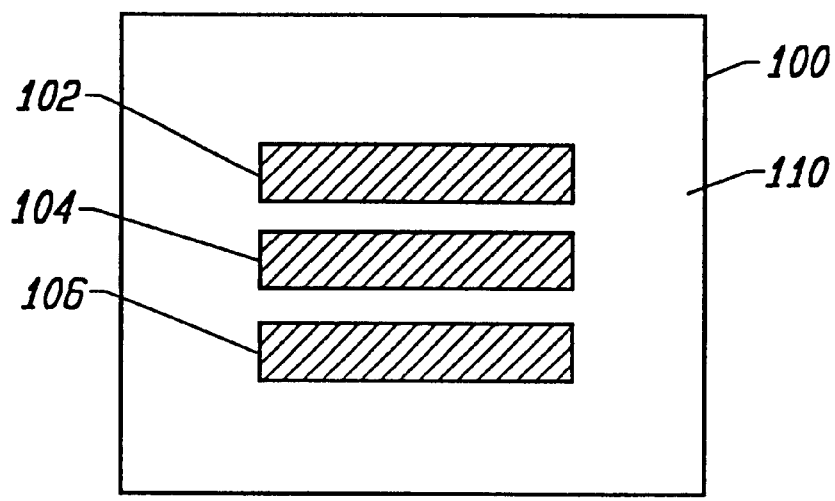
FIG. 1A illustrates a conventional reticle having an IC design pattern outlined in, for example, chromium on a glass backing.
Figure 1B:
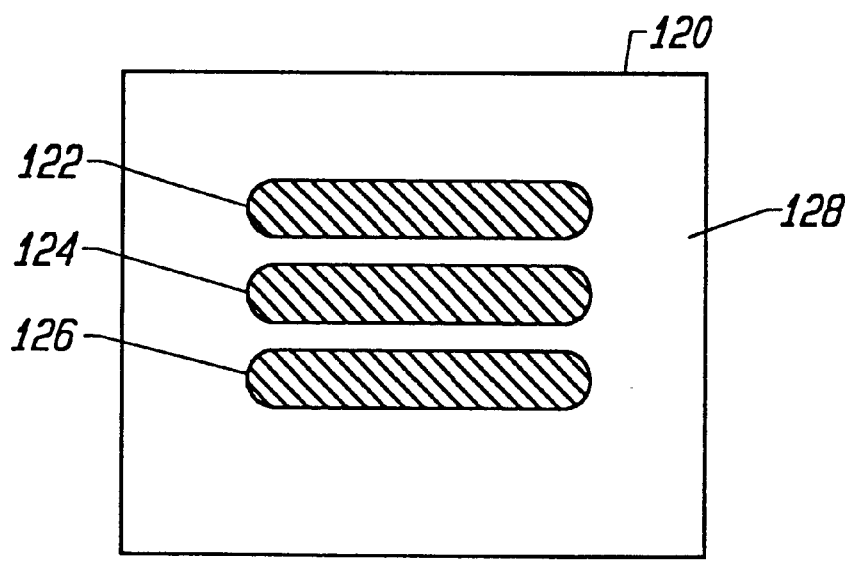
FIG. 1B shows an illumination pattern produced on a substrate by light shown through the reticle of FIG. 1A. The illumination pattern exhibits rounding and thinning effects that result when no optical proximity correction is performed.
Figure 1C:
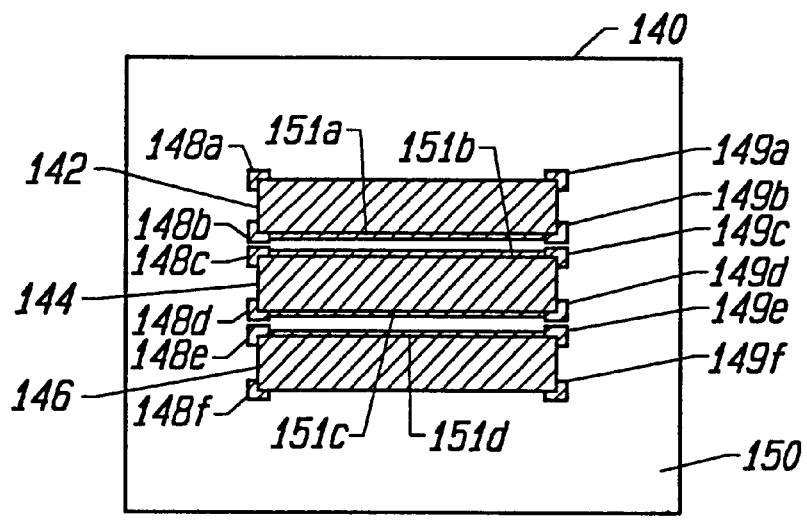
FIG. 1C illustrates a conventional reticle design employing optical proximity correction to overcome the rounding and thinning effects in the illumination pattern of FIG. 1B.
Figure 1D:
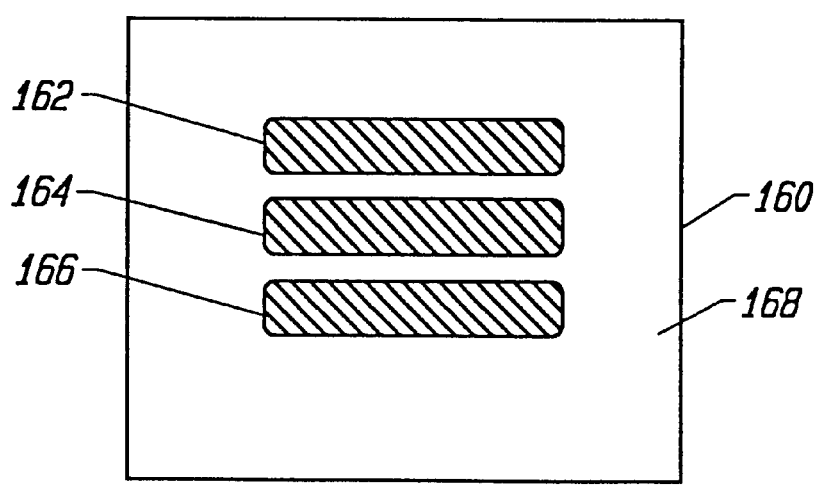
FIG. 1D shows an improved illumination pattern produced on a substrate by light shown through the optical proximity corrected reticle of FIG. 1C.
Figure 2A:
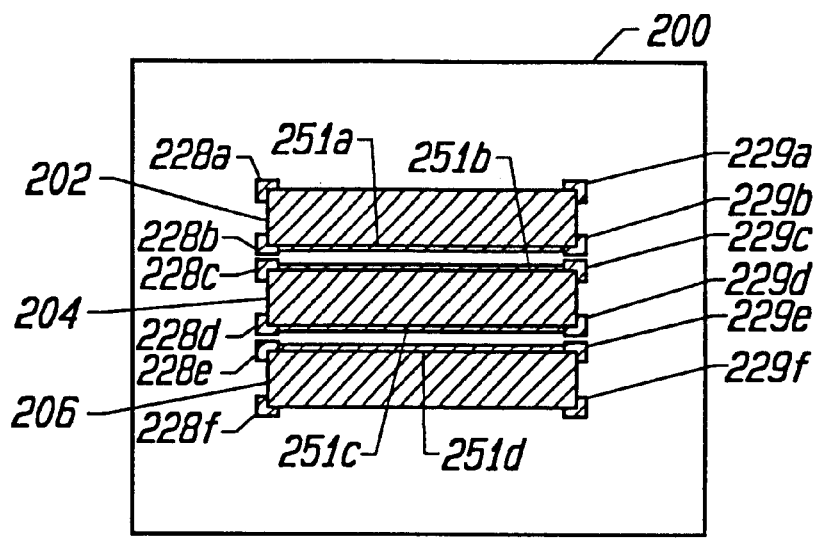
FIG. 2A illustrates a conventional optical proximity corrected reticle design for an IC design having critical dimensions in a non-linear correction regime.
Figure 2B:
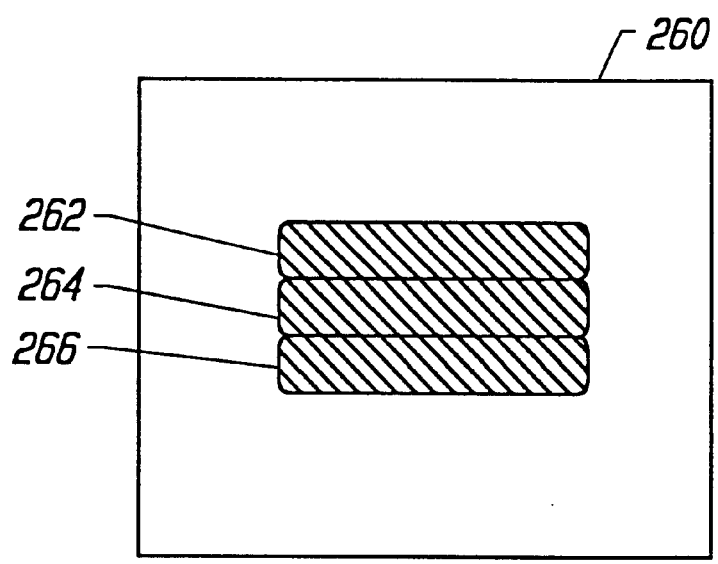
FIG. 2B shows a resulting fused illumination image produced on a substrate by light shown through the reticle of FIG. 2A.
Figure 7A:
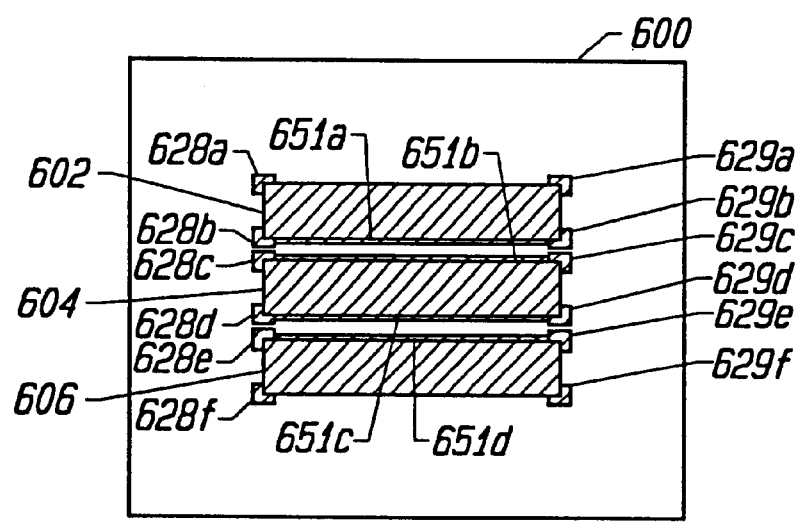
FIG. 7A illustrates a novel reticle design employing optical proximity correction obtained from a non-linear function to overcome the problematic effects noted in the illumination pattern of FIG. 2B.

FIG. 7A represents a reticle pattern having feature edges with critical dimensions in the non-linear regime (e.g., critical dimensions below about 0.5 microns or greater). As illustrated in FIG. 2B, conventional optical proximity correction of an amount calculated for a linear case fails to prevent fusing in the developed resist regions. However, the non-linear optical proximity correction method of this invention is able to provide a correct degree of correction for very small features.

As shown in FIG. 7A, a reticle 600 includes three symmetric features 602, 604, and 606. In addition, after the appropriate corrections have been determined from the appropriate non-linear function, specific corrective segments and/or serifs 35 were added. Specifically, the particular corrective serifs include regions 628a through 628f and 629a through 629f appended to each of the corners of features 602, 604 and 606. In addition, segments 651a through 651d were added to prevent feature thinning. Although no serifs or segments were shown subtracted from features 602, 604 and 606, more complex IC designs may require such corrective deletions.

Figure 7B:
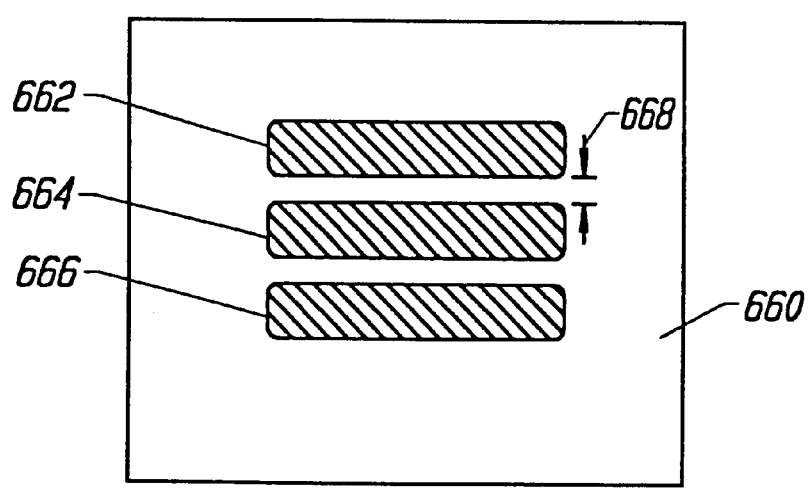
FIG. 7B shows an improved illumination pattern produced on a substrate by light shown through the optical proximity corrected reticle of FIG. 7A.

FIG. 7B shows an illumination pattern produced on a substrate 660 by light shining through reticle 600. As can be seen, illumination pattern 660 includes three dark regions 662, 664, and 666 separated from one another. For example, dark regions 662 and 664 are separated from one another by a light region 668. In contrast, the illumination pattern created by a linearly corrected reticle (e.g., see FIG. 2B) has fused dark regions. As mentioned above, the fused resist structure of FIG. 2B is a product of applying conventional optical proximity correction which fails to consider the non-linear behavior of correction associated with critical dimensions below a transition dimension (e.g., about 0.5 microns or greater).

C. Optical Proximity Correction Implementing Design Rule Checkers

In another embodiment of the present invention, a design rule checker (DRC) is used to scan a layout design for space increments that lie between selected features having a particular thickness. Once the space increments are identified, the DRC checker is configured to perform a number of operations to correct edges of the features that define a boundary for the selected space increment. The amount of correction is preferably determined from a non-linear mathematical expression, that is used to construct a correction table. The correction table therefore defines the amount of correction that will be performed to each of the edges that bound the selected space increments. Once the correction is complete for features having the selected space increment, a new space increment is selected for correction by the DRC checker. Accordingly, the DRC checker will rapidly check a layout design any number of times depending on the number of space increments selected for correction.

Figure 8A:
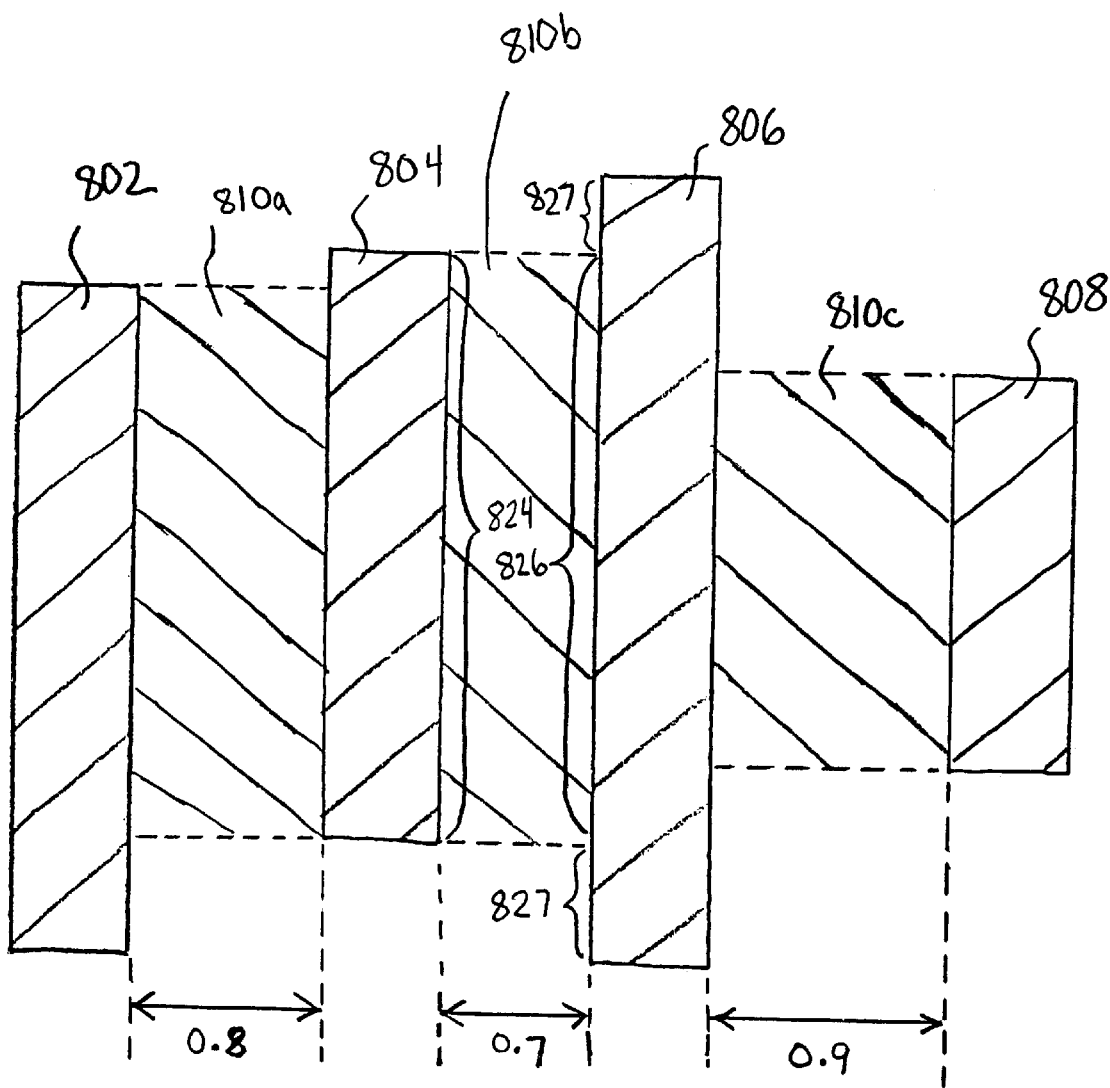
FIG. 8A shows a top view of a layout design including a number of features in accordance with one embodiment of the present invention.

FIG. 8A shows a top view of a layout design including a number of features in accordance with one embodiment of the present invention. As shown, a feature 802 is separated from a feature 804 by a space area 810a. In this example, the space area 810a is measured from an edge of the feature 802 and an edge of the feature 804, and is shown to measure about 0.8 microns. A space area 810b is also shown lying between the feature 804 and a feature 806. In this example, the separation between an edge 824 of features 804, and an edge 826 of a feature 806 is shown to be about 0.7 microns.

And finally, a space area 810c is shown lying between an edge of the feature 806 and an edge of the feature 808. The separation between the edges of features 806 and 808 is shown to be about 0.9 microns.

In this embodiment, inspection of the layout design is performed using a DRC checker that is well suited to identify those features that have space separations of a given amount. For example, the DRC checker may select all of those features having a space separation of about 0.7 microns throughout a given layout design. Once those features are identified, a number of boolean logic operations are performed by the DRC checker to implement predetermined corrections that compensate for optical proximity errors.

After the corrections have been performed for those features that have spaces of about 0.7 microns, the DRC checker will move to identify all of those features that have a separation of about 0.8 microns. Once those features are identified, the same boolean logic operations are performed to correct the edges of the features that bound the space area 810a. Once all features having a separation of 0.8 microns are corrected, the DRC checker will preferably move to identify all features having spaces of about 0.9 microns. In this example, this separation exists between the edges of feature 806 and feature 808.

It is important to note that the edge corrections of the features is preferably only performed on those feature edges that bound a selected space area. By way of example, edge 824 of feature 804, and edge 826 of feature 806 bound the space area 810b. However, edges 827 of feature 806 fail to bound the space area 810b, and therefore, are not subject to correction.

Figures 8B, 8C:
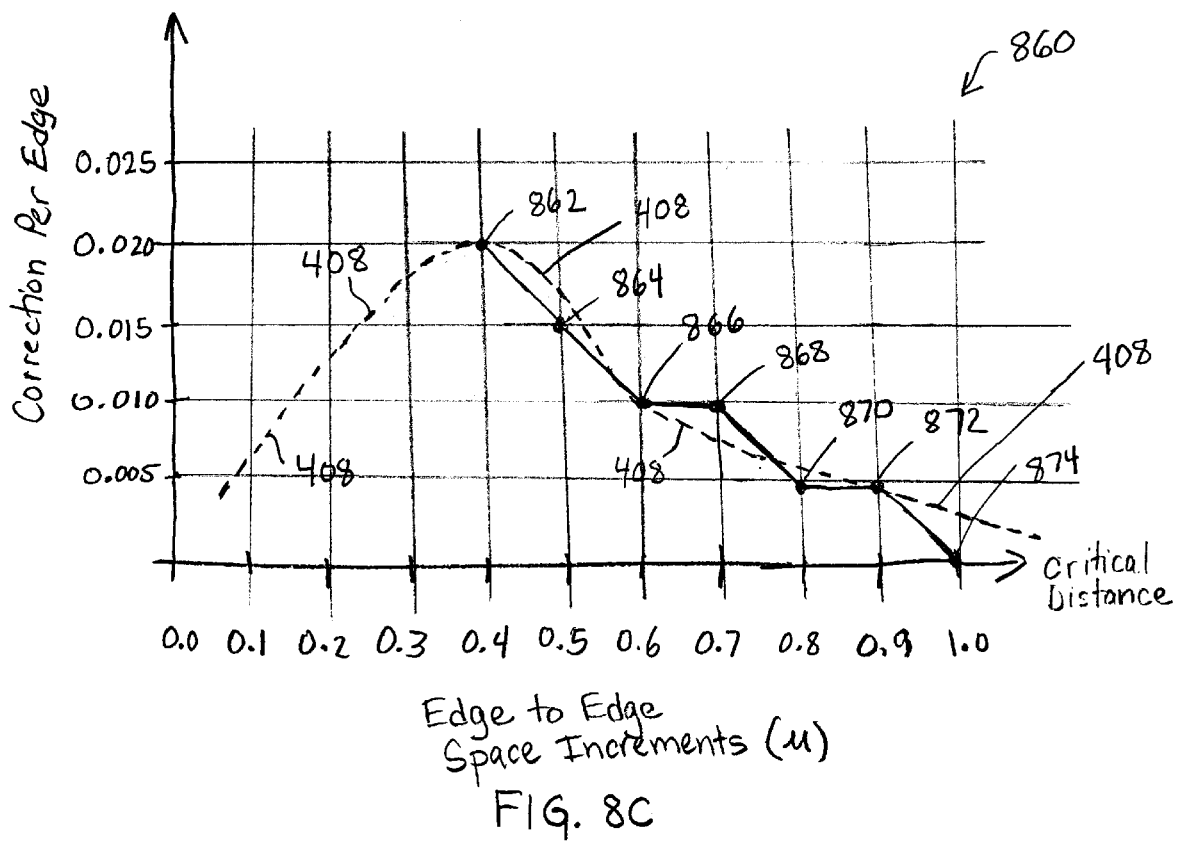
FIG. 8B shows a table having pre-determined correction values that are to be applied by the DRC checker depending on the inter-feature spacing that is selected for correction in accordance with one embodiment of the present invention.
FIG. 8C shows a graph plotting the "correction per edge" versus the "edge-to-edge space increments" in accordance with one embodiment of the present invention.

FIG. 8B shows a table having pre-determined correction values that are to be applied by the DRC checker depending on the inter-feature spacing that is selected for correction in accordance with one embodiment of the present invention. For example, when the edge-to-edge space increment lying between two respective features is about 0.4 microns, a correction of about 0.02 microns is applied to each edge that bounds a given space area. Therefore, the correction per edge will vary depending on the particular edge-to-edge space increment being corrected in a particular DRC correction cycle.

By way of example, once all features having the edge-to-edge space increment of 0.4 microns have been corrected, the DRC checker will proceed to identify those features having an edge-to-edge space increment of about 0.5 microns. In this example, the correction per edge is set to be about 0.015 microns. Accordingly, the DRC checker will then perform the corrections for those features having edge-to-edge space increments of about 0.6 microns, about 0.7 microns, about 0.8 microns, about 0.9 microns, and about 1.0 micron.

At each correction cycle, the appropriate correction for each edge will be applied to the features in order to rectify the anticipated optical proximity errors. In general, the correction per edge will be performed in grid increments, which are typically pre-set for a particular layout design. In this example, the grid increments are pre-set to about 0.005 microns. Of course, any other grid increment may be selected depending on the granularity desired for a particular integrated circuit design. Further, although corrections were only performed for those features having edge-to-edge space increments of between about 0.4 microns and about 1.0 micron, the range may be widened or narrowed depending on the degree of precision desired. For example, this correction technique can be implemented for wavelengths down to 180 nm, which correlates to edge-to-edge space increments as small as about 0.18 microns or smaller. However, as spaces increase to dimensions of about 1.0 micron or more, optical proximity errors will generally be less critical to a given design, and therefore may be ignored.

FIG. 8C shows a graph 860 plotting the "correction per edge" versus the "edge-to-edge space increments" in accordance with one embodiment of the present invention. One example of the non-linear curve 408 of FIG. 4 is also plotted to illustrates the degree of non-linear correction that should be performed on each edge of a particular feature being corrected. However, in this embodiment, a DRC checker is used to perform corrections on incremental amounts, that are determined by the grid dimension being implemented. Therefore, the corrections per edge may actually be slightly off from the non-linear curve 408, but still accurately represent the degree of correction desired for a particular feature edge.

As illustrated, features having an edge-to-edge space increment of about 0.4 microns will implement a correction of about 0.02 microns, that corresponds to a point 862 that lies along the non-linear curve 408. However, for features having an edge-to-edge space increment of about 0.5 microns, the correction per edge will be about 0.015 microns, as represented by a point 864. In this example, point 864 does not lie directly on the non-linear curve 408, but is sufficiently close to the non-linear curve 408 to approximate the degree of correction that is precise enough for a particular design. Of course, if a higher degree of precision is desired, the grid dimension may be decreased to enable a closer fit to the non-linear curve 408.

Corrections for features having an edge-to-edge space increment of about 0.6 microns will lie approximately along the non-linear curve 408 as shown by a point 866. For edge-to-edge space increments of about 0.7 microns, the correction per edge will be about 0.010, as shown by a point 868 that lies sufficiently close to the non-linear curve 408. For edge-to-edge space increments of about 0.8 microns and about 0.9 microns, the correction per edge will be about 0.005 microns (i.e., for points 870 and 872). Finally, for edge-to-edge space increments of 1.0 micron or greater, the correction per edge will be set to 0.00, because the non-linear curve 408 may approach zero as critical dimensions increase. As mentioned above, as edge-to-edge space increments increase in size, the effects of optical proximity errors will also decrease, thereby reducing the need to perform corrections.

Figure 8D:
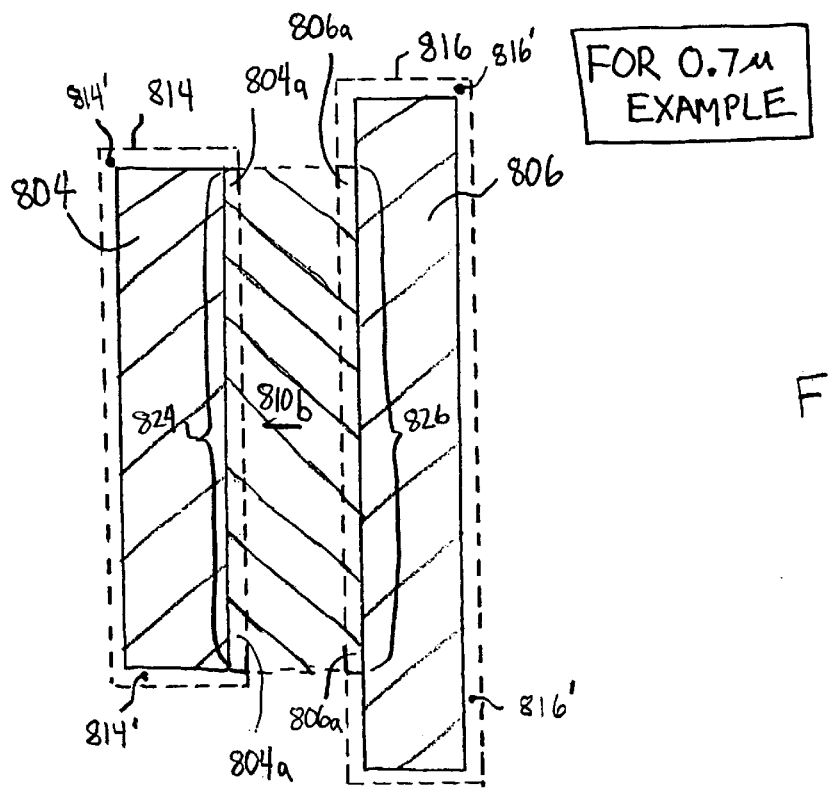
FIG. 8D shows the layout design of FIG. 8A during a correction operation that is performed by the DRC checker in accordance with one embodiment of the present invention.

FIG. 8D shows the layout design of FIG. 8A during a correction operation being performed by the DRC checker in accordance with one embodiment of the present invention. For ease of understanding, reference will be made to those features having an edge-to-edge space increment of about 0.7 microns. In this case, the edges 824 and 826 of features 804 and 806, respectively, will be corrected. In a first operation, the DRC checker will perform an oversize operation that increases the size of features 804 and 806 to a size 814 and 816, respectively.

Generally, the oversize operation increases the size of each feature by an amount equal to the correction per edge number identified in the table 850 of FIG. 8B. As a result of the oversize operation, an area 814' and 816' will lie between the outline of features 804 and 806 and the oversize outline 814 and 816. Next, a boolean AND operation is performed between the space area 810b and the areas 814' and 816' of each respective feature. The result of this boolean AND operation will therefore generate a correction area 804a along the edge 824 of feature 804, and a correction area 806a along the edge 826 of feature 806. These correction areas 804a and 806a are therefore the result of the boolean AND operation.

Figure 8E:
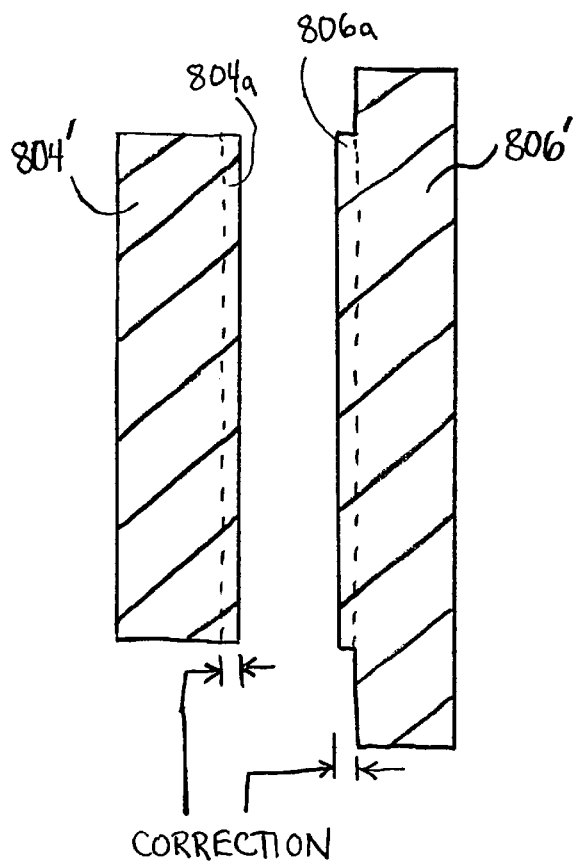
FIG. 8E is a top view of a set of features after the DRC checker has performed optical proximity correction (OPC) in accordance with one embodiment of the present invention.

FIG. 8E is a top view of features 804' and 806' after the DRC checker has performed optical proximity correction (OPC) in accordance with one embodiment of the present invention. As shown, feature 804' now has an extension that is equivalent to the correction area 804a, and feature 806' has an extension that is equivalent to the correction area 806a. However, these extensions 804a and 806a were only added along the edges 824 and 826 that bound the space area 810b.

Figure 9:
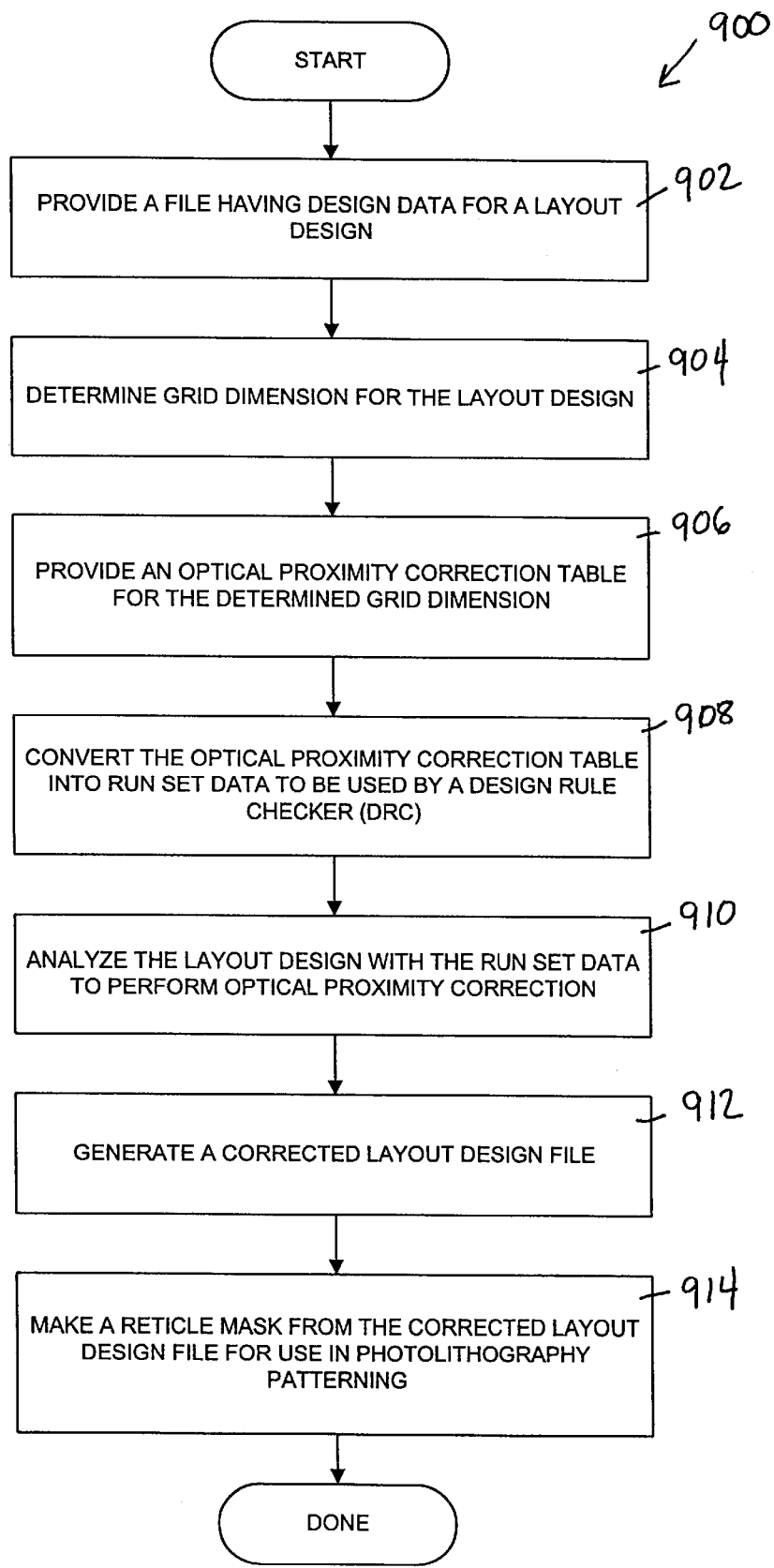
FIG. 9 is a flowchart diagram illustrating the preferred method operations performed in correcting a layout design using a DRC checker in accordance with one embodiment of the present invention.

FIG. 9 is a flowchart diagram 900 illustrating the preferred method operations performed in correcting a layout design using a DRC checker in accordance with one embodiment of the present invention. The method begins at an operation 902 where a file having design data for a layout design is provided. For example, the design data may identify X and Y coordinates for each of the features in a given layout design, and may be provided in the form of a digital file. The file may either be embodied on a floppy disk, a tape, an optical disc, or transferred over a computer network.

The method then proceeds to an operation 904 where a grid dimension for the layout design is determined. In one example, the grid dimension will be about 0.005 microns. However, the grid dimension may be increased or decreased depending on the precision desired for a particular correction operation. Once the grid dimension for the layout design has been determined in operation 904, the method will proceed to an operation 906. In operation 906, an optical proximity correction table is provided for the determined grid dimensions. By way of example, the optical proximity correction table preferably identifies the edge-to-edge space increments, and the correction per edge as shown in table 850 of FIG. 8B above. In this example, the table 850 is optimized for features having a width of about 0.4 microns. Therefore, other correction values may be implemented for features having different widths.

The method then proceeds to an operation 908 where the optical proximity correction table is converted into run-set data that is to be used by a design rule checker (DRC). Next, the method will proceed to an operation 910 where the layout design is analyzed with respect to the generated run-set data to perform optical proximity correction. Once the optical proximity correction has been performed for the entire layout design based on the run-set data obtained in operation 908, the method will proceed to an operation 912. In operation 912, a corrected layout design file is generated. Once the file is generated, the method will proceed to an operation 914 where a reticle mask is made from the corrected layout design file, and may then be used in photolithography patterning.

Figure 10:
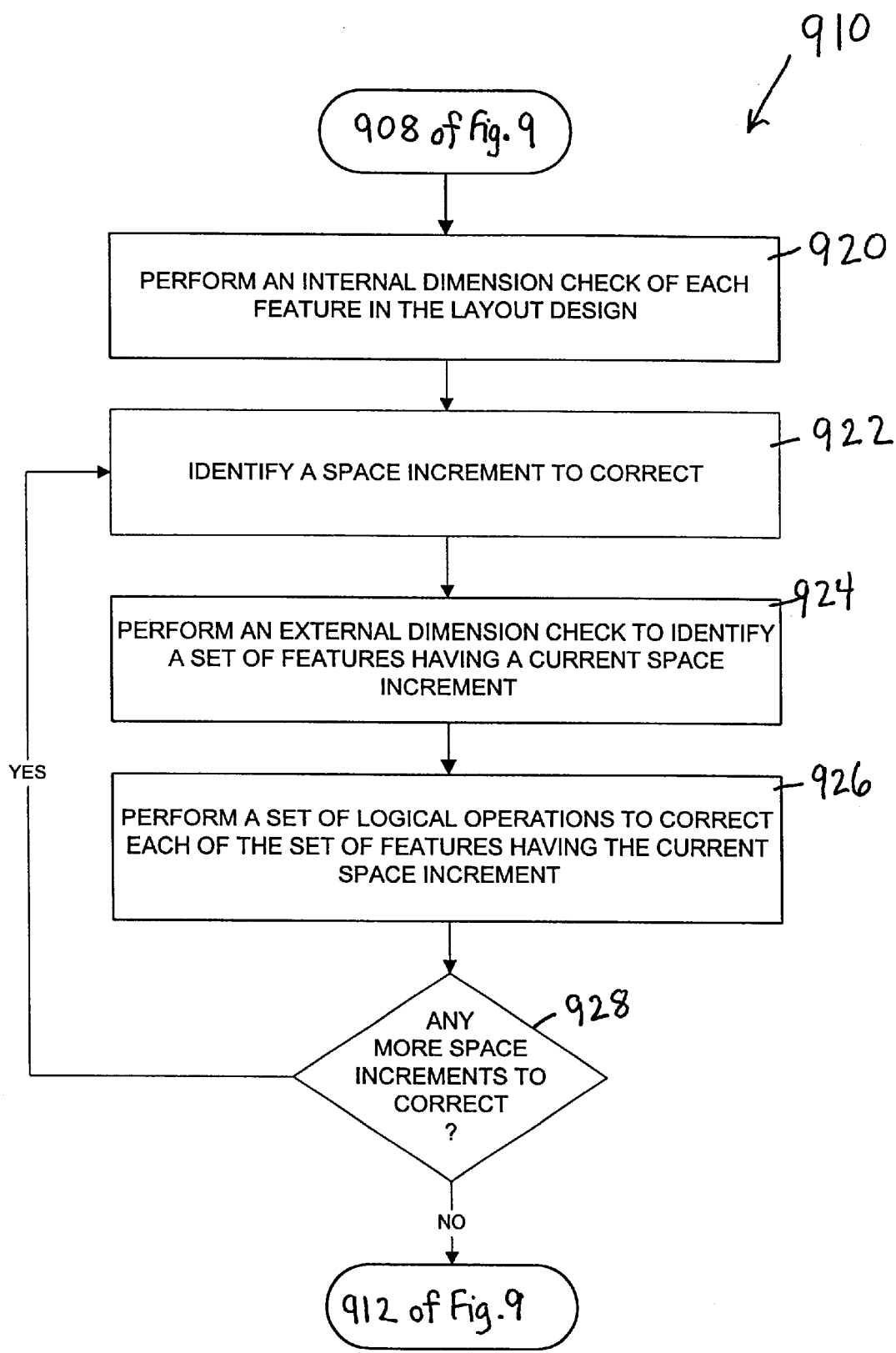
FIG. 10 is a more detailed flowchart diagram illustrating the analysis being performed by the DRC checker in accordance with one embodiment of the present invention.

FIG. 10 is a more detailed flowchart diagram illustrating the analysis being performed by the DRC checker in accordance with one embodiment of the present invention. Continuing from operation 908 of FIG. 9, the analysis begins at operation 920. In operation 920, an internal dimension check is performed for each feature in the layout design. The internal dimension check is configured to identify all features having a given width. For example, all features having a particular width may be transistor gate electrodes or minimum interconnect lines, which may be more important to correct for optical proximity errors. In this example, the internal dimension check is configured to identify all features having a width of about 0.4 microns. When the internal check operation is performed, all other features having smaller or greater width dimensions are omitted from correction (e.g., some larger features may include power and ground pads).

Once the internal dimension check has been performed in operation 920, only those features that will benefit from optical proximity correction will remain (i.e., as shown in FIG. 8A). The method will now proceed to an operation 922 where a space increment is identified for correction. As described above, the entire layout design is preferably corrected in cycles, where only those features having a particular space increment are corrected, and then features having a different space increment are corrected, etc. For example, assuming that the space increment to be identified is a 0.7 micron edge-to-edge space increment, then only those features having the about 0.7 micron space increment will be analyzed by the DRC checker in an initial cycle.

The method will then proceed to an operation 924 where an internal dimension check is performed to identify the set of features having the current space increment identified in operation 922. Once those features having the current space increment are identified, the method will proceed to an operation 926 where a set of logical operations are performed to correct each of the set of features having the current space increment. Once the logical operations have been performed to correct those features having the current space increment, the method will proceed to a decision operation 928 where it is determined whether any more space increments remain to be corrected. If more space increments remain, the method will proceed back up to operation 922, where the next space increment to correct is identified. For example, if the previous space increment was 0.7 microns, the next space increment may be 0.8 microns.

After the space increment to correct has been identified, the method will proceed to operation 924 where an external dimension check is performed throughout the layout design to identify the set of features having the current space increment (i.e., 0.8 microns). Next, the method will proceed to operation 926 where the set of logical operations are performed to correct each of the sets of features having the current space increment. Again, the method will proceed to decision operation 928 where it is determined if there are anymore space increments to correct. If all of the space increments desired for correction have been processed, the method will proceed to operation 912 of FIG. 9.

Figure 11:
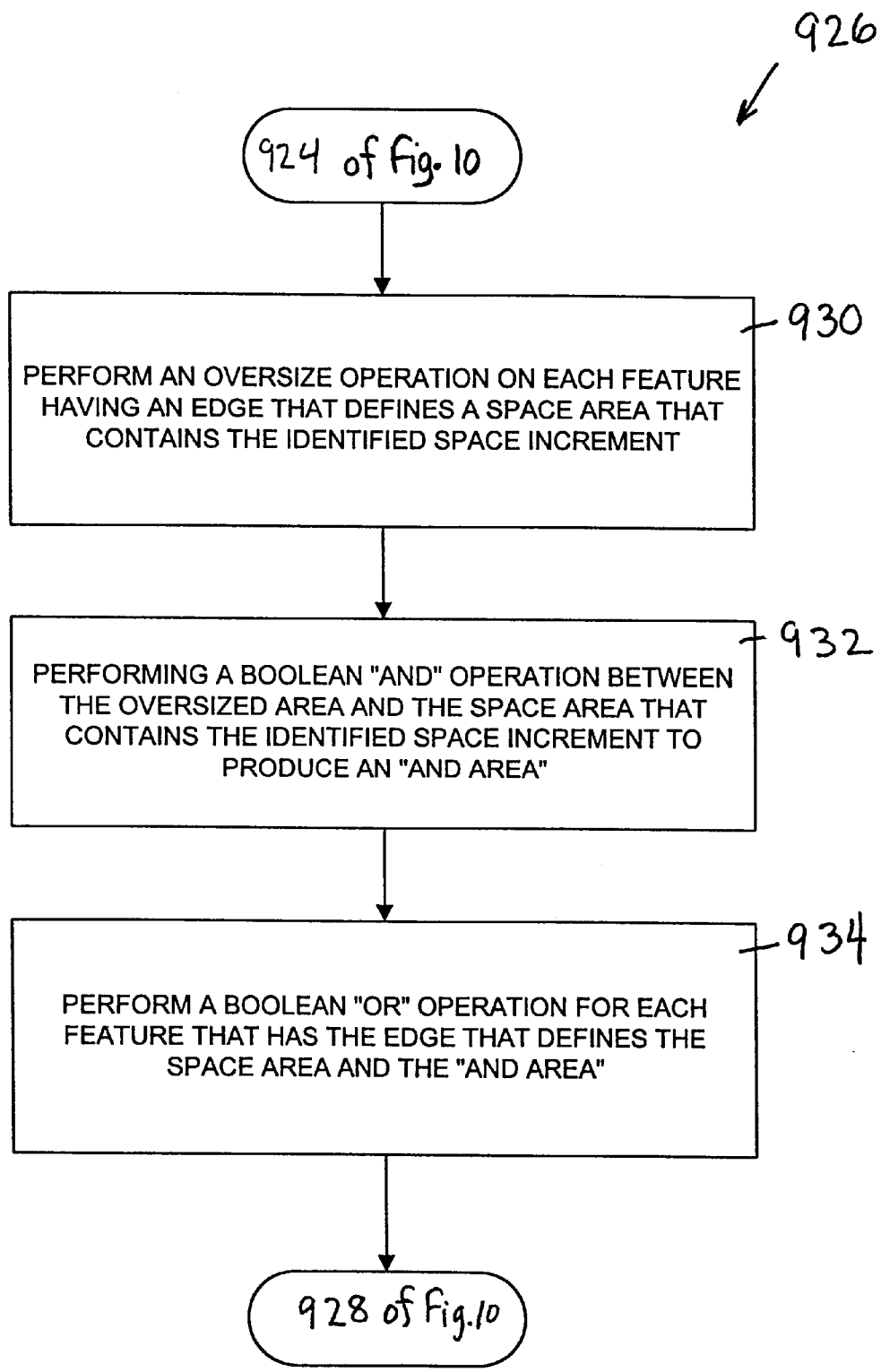
FIG. 11 is a more detailed flowchart diagram of the method operations completed when the set of logical operations are performed in accordance with one embodiment of the present invention.

FIG. 11 is a more detailed flowchart diagram of the method operations completed when the set of logical operations are performed in operation 926 of FIG. 10. The method initially proceeds to an operation 930 where an oversize operation is performed on each feature having an edge that bounds a space area that contains the identified space increment. By way of example, FIG. 8D shows that features 804 and 806 have been oversized because the space area 810b was identified by the DRC checker to have the identified space increment.

Once the oversize operation has been performed, the method will proceed to an operation 932 where a boolean "AND" operation is performed between the oversized area (e.g., 814' and 816' of FIG. 8D), and the space area (e.g., 810b) that lies within the identified space increment. The boolean AND operation will therefore produce an "AND area," that represents the corrected areas 804a and 804b of FIG. 8D. Next, the method will proceed to an operation 934 where a boolean "OR" operation is performed for each feature that has an edge (i.e., 924 and 926) that defines a space area (e.g., features 804 and 806 having edges 824 and 826 that define the space area 810b), and the "AND area" (e.g., 804a and 804b). After the boolean OR operation is performed, corrected features will result with the addition of corrective areas. For example, FIG. 8E shows corrected features 804' and 806' having the addition of the corrective areas 804a and 804b at the respective edges 824 and 826.

Although the preferred embodiments of the present invention have been described in detail, it should be understood that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope of the appended claims.

What is claimed is:

1. A method for correcting a layout design using a design rule checker, comprising:

providing a layout design file having the layout design that is to be corrected for optical proximity by the design rule checker;

providing a run set to the design rule checker, the run set includes a plurality of correction values that are used to correct, based on a correction value derived from a non-linear correction curve, a plurality of features of the layout design that have a selected space dimension;

identifying each of the plurality of features that have the selected space dimension; and correcting each of the plurality of features that have the selected space dimension with one correction value of the plurality of correction values of the run set.

2. A method for correcting a layout design using a design rule checker as recited in claim 1, wherein the run set is generated from a correction table that has the plurality of correction values.

3. A method for correcting a layout design using a design rule checker as recited in claim 2, wherein the correcting of each of the plurality of features that have the selected space dimension is performed on edges of the plurality of features, and the edges of at least two of the plurality of features define the selected space dimension.

4. A method for correcting a layout design using a design rule checker as recited in claim 1, wherein the correcting of each of the plurality of features further includes:

perform an oversize operation on each of the plurality of features that have the selected space dimension, the oversize operation being configured to define an oversize perimeter that extends a size of each of the plurality of features by a correction value that corresponds to the selected space dimension, and an oversized area is defined between an outline of each of the plurality of features and the oversize perimeter.

5. A method for correcting a layout design using a design rule checker as recited in claim 4, wherein the correcting of each of the plurality of features further includes:

performing a boolean AND operation between the oversized area and a space area that lies between each of the plurality of features that have the selected space dimension, the boolean AND operation thereby producing an AND result.

6. A method for correcting a layout design using a design rule checker as recited in claim 5, wherein the correcting of each of the plurality of features further includes:

performing a boolean OR operation for each of the plurality of features that have the selected space dimension and the AND result.

7. A method for correcting a layout design using a design rule checker as recited in claim 6, wherein the boolean OR operation produces a plurality of corrected features, and the plurality of corrected features are the plurality of features that were identified to have the selected space dimension.

8. A method for correcting a layout design using a design rule checker as recited in claim 1, wherein the identifying of each of the plurality of features that have the selected space dimension is repeated for other selected space dimensions.

9. An apparatus for correcting a layout design for optical proximity correction errors, comprising:

a design layout file containing the layout design; and a design rule checker configured to iteratively correct the layout design, such that a set of features having a selected inter-feature spacing are corrected, based on a correction value derived from a non-linear correction curve, before a next set of features having another selected inter-feature spacing;

wherein the design rule checker continues to iteratively correct the layout design until a predetermined number of sets of features are corrected.

10. An apparatus for correcting a layout design for optical proximity correction errors as recited in claim 9, wherein each of the predetermined number of sets of features are associated with a particular correction value.

11. An apparatus for correcting a layout design for optical proximity correction errors as recited in claim 10, wherein the particular correction value is derived from a non-linear curve, and the particular correction value is adjusted to a closest grid increment of the layout design.

12. An apparatus for correcting a layout design for optical proximity correction errors as recited in claim 11, wherein the design rule checker implements the particular correction value to perform a series of boolean operations to complete one of the iterative corrections of the layout design.

13. An apparatus for correcting a layout design for optical proximity correction errors as recited in claim 12, wherein the one of the iterative corrections are configured to correct a pair of edges of the set of features and the next set of features, and the pair of edges bound the selected inter-feature spacing and the another selected inter-feature spacing.

14. An apparatus for correcting a layout design for optical proximity correction errors as recited in claim 13, wherein the pair of edges are corrected by an amount equal to the particular correction value.

15. In a system for performing optical proximity correction on a layout design file, a process comprising:

(a) identifying features having a particular width from the layout design file;

(b) selecting a set of features from the identified features having a predetermined inter-feature spacing, the inter-feature spacing being defined by edges of the selected set of features; and (c) correcting the selected set of features based on a correction value derived from a non-linear correction curve, the correcting being performed on the edges of the selected set of features.

16. A process as recited in claim 15, wherein operations (b) and (c) are repeated for one or more selected sets of features having different inter-feature spacings.

17. A process as recited in claim 16, wherein the correction value that is derived from the non-linear curve is part of a correction value table, and a particular correction value is associated with the different inter-feature spacings.

18. A process as recited in claim 15, wherein the correcting the selected set of features includes performing a set of logical operations.

19. A process as recited in claim 18, further comprising:

performing the set of logical operations with the aid of a design rule checker.

20. A process as recited in claim 19, wherein the set of logical operations include:

performing an oversize operation on the selected set of features to produce an oversize outline, the oversize operation being configured to increase the size of the selected set of features by an amount that is equivalent to the correction that is the value derived from the non-linear correction curve.

21. A process as recited in claim 20, wherein the set of logical operations include:

performing a boolean AND operation between an area defined between the selected set of features and the oversize outline, and a area that lies between the edges of the selected set of features, the boolean AND operation thereby producing a set of correction areas.

22. A process as recited in claim 21, wherein the set of logical operations include:

producing a set of corrected features that include an area of the selected set of features and the set of correction areas.

* * * * *